(12) United States Patent
Gopal

(10) Patent No.: US 9,590,605 B2
(45) Date of Patent: Mar. 7, 2017

(54) GLITCH FILTER CIRCUIT AND METHOD

(71) Applicant: NXP B.V., Eindhoven (NL)

(72) Inventor: Kiran Gopal, Palakkad, IN (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/687,896

(22) Filed: Nov. 28, 2012

(65) Prior Publication Data
US 2014/0055165 A1    Feb. 27, 2014

(30) Foreign Application Priority Data
Aug. 21, 2012 (IN) .......................... 2584/DEL/2012

(51) Int. Cl.
*H03K 5/14* (2014.01)
*H03K 5/1252* (2006.01)
*H03K 19/003* (2006.01)

(52) U.S. Cl.
CPC ............. *H03K 5/1252* (2013.01); *H03K 5/14* (2013.01); *H03K 19/00369* (2013.01)

(58) Field of Classification Search
CPC .......................... H03K 5/1252; H03K 5/1534

USPC .. 327/34, 31, 18, 20, 35, 37, 263, 268, 290, 327/399, 401, 551; 326/52, 54
See application file for complete search history.

(56) References Cited

U.S. PATENT DOCUMENTS

| | | | |
|---|---|---|---|
| 3,939,413 A | 2/1976 | Milkovic | |
| 4,471,235 A * | 9/1984 | Sakhuja et al. | ................. 327/34 |
| 4,926,072 A * | 5/1990 | Hyodo | ............................ 327/22 |
| 2010/0090739 A1 | 4/2010 | Huang | |

FOREIGN PATENT DOCUMENTS

| | | |
|---|---|---|
| CN | 101202615 A | 6/2008 |
| DE | 3225800 C1 | 12/1983 |
| JP | 54-025148 A | 2/1979 |

* cited by examiner

*Primary Examiner* — Jung Kim

(57) ABSTRACT

A glitch filter circuit has a filter/delay part that always operates on rising or falling pulses for both rising edges and falling edges of the input signal. In this way, the filter delay can be made symmetrical and the circuit will have no duty cycle distortion. The rise and fall delays will track each other when there are PVT (Process, Voltage and Temperature) variations.

6 Claims, 4 Drawing Sheets

GLITCH FILTER CIRCUIT AND METHOD

CROSS-REFERENCE TO RELATED APPLICATIONS

This application claims the priority under 35 U.S.C. §119 of Indian patent application no. 2584/DEL/2012, filed on Aug. 21, 2012, the contents of which are incorporated by reference herein.

The invention relates to glitch filter circuits and methods.

A glitch filter is a circuit that stops narrow pulses and allows only wider pulses to pass. This is effective in filtering out switch chatter and other noises in electronic systems. Many standards require glitch filters as a part of the system, such as IIC, SWP, SLIM etc. Glitch filters are part of most Input/Output circuits.

Known glitch filters use either RC circuits or current source and capacitor circuits to create a delay for filtering glitches.

FIG. 1 shows an existing glitch filter circuit.

The circuit comprises an input buffer 10 and an RC filter 12. The output is provided by an output buffer 14 which has hysteresis.

The input buffer typically comprises inverter gates, having a PMOS top transistor and an NMOS bottom transistor in series between power rails. The input is provided to the transistor gates, and the gate either pulls its output high or low. As a result, separate resistors (or current sources) are involved in the filtering of rising and falling glitches, since the PMOS and NMOS resistances are different.

This causes differences in the rise and fall delays of the system. Even if the same resistors and capacitors are used in the RC circuit, there may be mismatch in the rise and fall delays because the next stage hysteresis buffer 14 will have skewed VIH and VIL values (VIL is the maximum input voltage which can be interpreted as a logic "0", VIH is the minimum input voltage which can be interpreted as logic "1") in different process corners.

Tuning the system to have matched rise and fall delays is possible for one process corner; however this will change with process, voltage and temperature variations (PVT).

Difference in rise and fall delays introduced by glitch filters can be a problem with filters which filter long pulses like 50 ns in IIC circuits. This could cause duty cycle distortion, upset system timing and can cause errors.

As outlined above, the causes of these problems can be that the hysteresis buffer may have skewed VIH and VIL levels, or different resistances could be used for rise and fall delays. It is impossible to tune the filter to avoid duty cycle distortion without a PVT compensation circuit. A PVT compensation circuit is complex and uses static power, so it is not used in I/O circuits.

The invention is concerned particularly with rise and fall delays becoming different and causing duty cycle distortion, rather than a general change of delays with PVT.

In a typical input circuit, each and every block introduces duty cycle distortion. Thus, distortion by one block can in theory be compensated elsewhere. However since filter delays are much larger (50 ns to 150 ns in IIC) compared to other blocks, duty cycle distortion added also will be much larger and impossible to compensate.

According to the invention, there is provided an apparatus and method as defined in the independent claims.

In one aspect, the invention provides a glitch filter circuit comprising:

an input circuit for detecting both rising and falling signal level transitions of an input signal at the input to the glitch filter;

a delay circuit at the output of the input circuit;

an output circuit for toggling the output of the glitch filter circuit between high and low levels; and a feedback path from the output circuit to the input circuit.

As a result of the feedback path (which feeds a delayed signal back to the input), the input circuit converts both rising and falling signal level transitions of the input signal at the input to the glitch filter circuit into pulses of the same type (i.e. either rising or falling pulses). These have a duration dependent on the delay of the delay circuit. Shorter duration glitch pulses at the input are passed by the input circuit, so that the output includes the generated pulses as well as the glitch pulses. The delay circuit in combination with the output circuit has the effect of filtering out these short duration glitch pulses. For example, the output circuit can be prevented from toggling when the pulses are too short.

The invention provides a glitch filter circuit that can have no duty cycle distortion. The delay circuit always operates on only rising or falling pulses for both rising edges and falling edges of the input signal. In this way, the delay function (which can be a filter function) can be made symmetrical, for example with the same RC time constant being applied. The rise and fall delays will track each other when there are PVT (Process, Voltage and Temperature) variations.

In one example, the input circuit comprises an XOR or XNOR gate having its inputs connected to the input and output of the glitch filter circuit.

The filter circuit preferably comprises an RC filter. This essentially functions as a delay element. Other basic glitch filter circuits can be used, including current source circuits.

The output circuit preferably comprises a latch circuit. This converts the pulses back into a signal stream.

Essentially, the input circuit doubles the signal frequency, by converting each signal level transition into a pair of transitions (i.e. a pulse) and the output circuit halves the frequency, by converting each pulse (i.e. two signal level transitions) back into a single signal level transition. Between the input circuit and output circuit functions, the glitch pulses are filtered.

The output circuit can comprise a toggle (T-type) flip flop.

The invention also provides an input/output circuit comprising a glitch filter circuit of the invention.

In another aspect the invention provides a glitch filtering method comprising:

using an input circuit to detect both rising and falling signal level transitions of an input signal and to generate pulses from the rising and falling signal level transitions, wherein shorter duration glitch pulses are also passed by the input circuit;

filtering out the shorter duration glitch pulses; and toggling an output signal between high and low levels in response to the generated pulses after the shorter duration glitch pulses have been filtered.

This method converts all signal level transitions into pulses of the same type, so that the filtering function operates in the same way for both rising and falling signal level transitions.

An example of the invention will now be described with reference to the accompanying drawings, in which.

The invention provides a glitch filter circuit which has a filter/delay part that always operates on rising or falling pulses for both rising edges and falling edges of the input signal. In this way, the filter delay can be made symmetrical and the circuit will have no duty cycle distortion. The rise and fall delays will track each other when there are PVT (Process, Voltage and Temperature) variations.

By using the same transition (rise or fall) of the delay elements in the circuit for both rise and fall transitions, there is no difference in rise and fall delays. In one example, a single rise or fall RC delay is re-used for both rise and fall.

Figure 2:
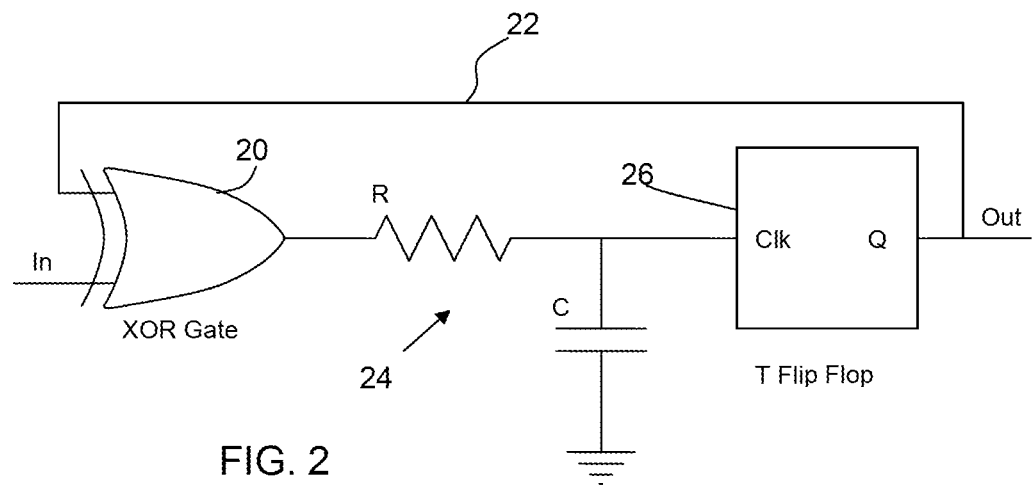
FIG. 2 shows a first example of glitch filter circuit of the invention in schematic form.

A first example of the circuit of the invention is shown in FIG. 2.

The input signal is passed through an input circuit 20 which converts a rise or fall transition in the input signal to a rising or falling pulse.

In the example shown, the input circuit is an XOR gate, and the output will be a rising pulse (i.e. a signal transition from low to high) for each signal level transition. The previous (i.e. delayed) value of the input is provided to one input of the XOR gate by means of a feedback path 22. The feedback path 22 in this way controls the duration of the pulse, and brings the output back down to the low level after a delay. This means that in a stable state, the XOR gate output is always returned to zero. A rising or falling edge at the input causes the XOR output to rise and generate a rising pulse.

This rising edge is then delayed by the RC filter circuit 24 which functions as a delay element.

The output of the filter circuit 24 is provided to an output circuit 26 which converts it back to the correct set of transitions at the output. This output circuit is shown as a toggle (T-type) flip flop circuit, with the filter circuit output connected to the clock port. This toggles the output each time there is a transition at the input. Other latch circuits can be configured to operate in the same way.

Essentially, the input circuit can be considered to double the signal frequency (by converting each transition to a double-transition pulse) and the output circuit can be considered to halve the signal frequency.

Figure 3:
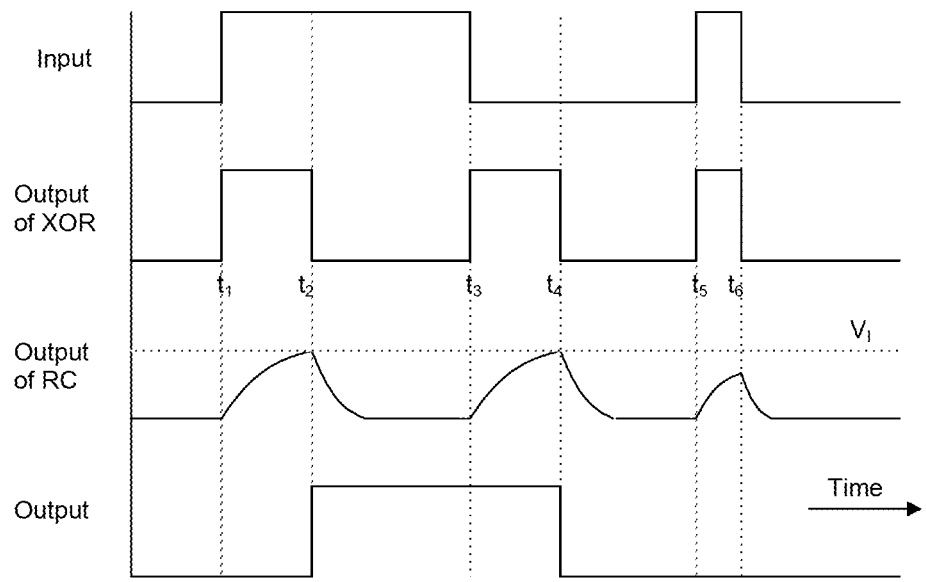
FIG. 3 shows a timing diagram for the circuit of FIG. 2.

FIG. 3 shows waveforms for the operation of the circuit of FIG. 2.

The top plot (input) is the input to the glitch filter circuit, shown as "In" in FIG. 2. The second plot is the output of the XOR circuit 20. The third plot is the output of the filter circuit 24, and the bottom plot is the output of the glitch filter circuit, shown as "Out" in FIG. 2.

At time $t_1$, the input goes from low to high. Since the output is low, the XOR gate gives a high transition to the RC filter circuit, which starts rising until it reaches a switching threshold at time $t_2$. For the circuit of FIG. 2, the threshold is a threshold of the flip flop 26. This causes the output of the toggle flip flop 26 to flip and go to high.

The feedback path now means that the XOR has both inputs equal and gives a low output. This causes the RC filter to fall back to zero.

At $t_3$, when the input goes low, the XOR gate again gives a high transition at the output and the filter cycle restarts. When the RC output reaches the threshold at $t_4$, the flip flop is toggled again and it goes low. This causes the XOR output to go low and the filter resets itself.

For both high and low transitions at the input, the filter is driven in the same way.

However if a glitch is present in the input (which is pulse of duration less than the pass band of the filter), as seen between time $t_5$ and $t_6$, it is not passed as it does not reach the threshold voltage of the flip flop 26. Thus, the filter behaves as required to filter out glitches by preventing them from inducing switching of the flip flop 26.

In a real implementation, a buffer stage is added after the RC delay 24 to give a higher value of VIH and to give a fast rising signal to the flip flop. There can also be provided a reset circuit that pulls down and resets the capacitor when the XOR output goes low. This helps in quickly pulling down the capacitor to zero so that it starts from zero in the next cycle and not from an intermediate value.

Figure 4:
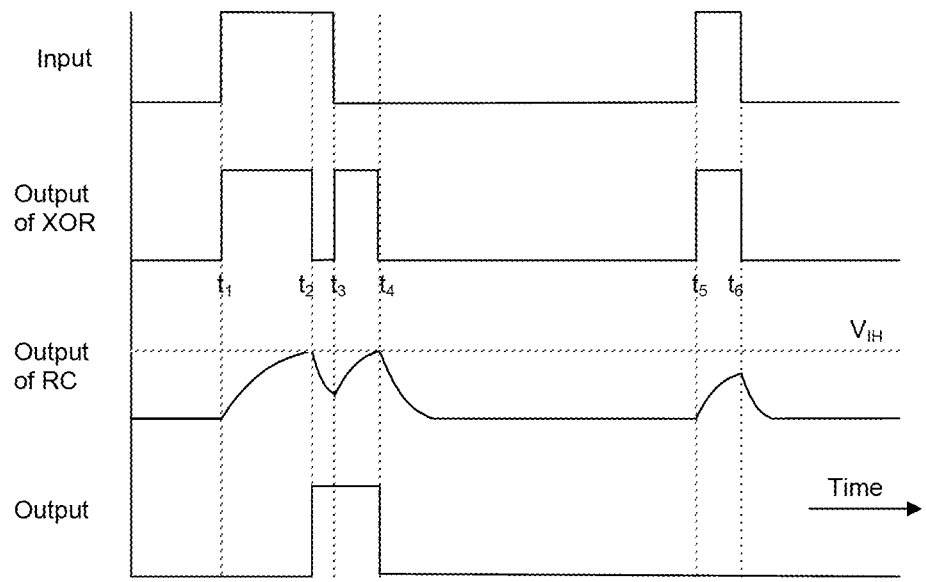
FIG. 4 shows a possible problem with the circuit of FIG. 3.

In the waveforms of FIG. 3, a gradual decay in the filter output voltage can be seen after times $t_2$, $t_4$ and $t_6$. As shown in FIG. 4, this can make the system behave erratically.

FIG. 4 shows a shorter input pulse which terminates not long after the flip flop 26 has switched (at time $t_2$). Because the filter output has not stabilised to zero, the time to reach the threshold of the flip flop 26 is reduced, so that the time period $t_3$ to $t_4$ is shorter than desired.

Figure 5:
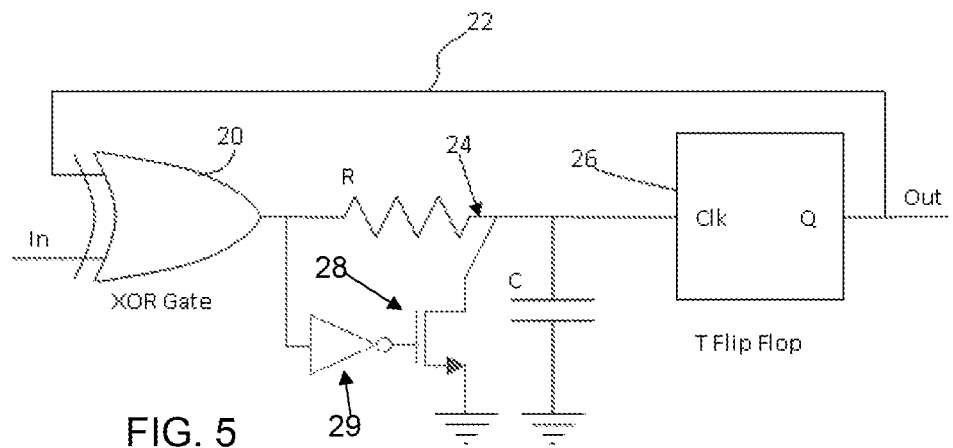
FIG. 5 shows a second example of glitch filter circuit of the invention in schematic form.
Figure 6:
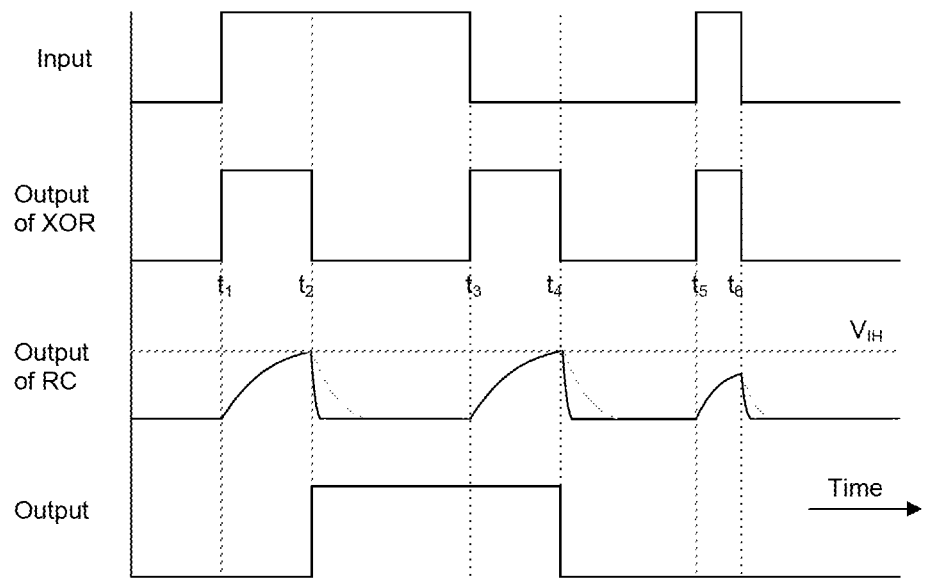
FIG. 6 shows a timing diagram for the circuit of FIG. 5.

To reduce this problem, the time taken by the capacitor to discharge can be reduced. FIG. 5 shows an additional transistor 28 gated by the inverse of the output of the XOR gate 20 (by means of inverter 29). These elements function as a reset circuit. The transistor pulls the filter output to ground when it is turned on, and this is when the output of the XOR gate is low. The effect is to increase the rate at which the filter output drops at the high-to-low transitions of the output of the XOR gate, as shown in FIG. 6. The waveform showing the output of the filter is changed at times $t_2$, $t_4$ and $t_6$ as shown.

Figure 7:
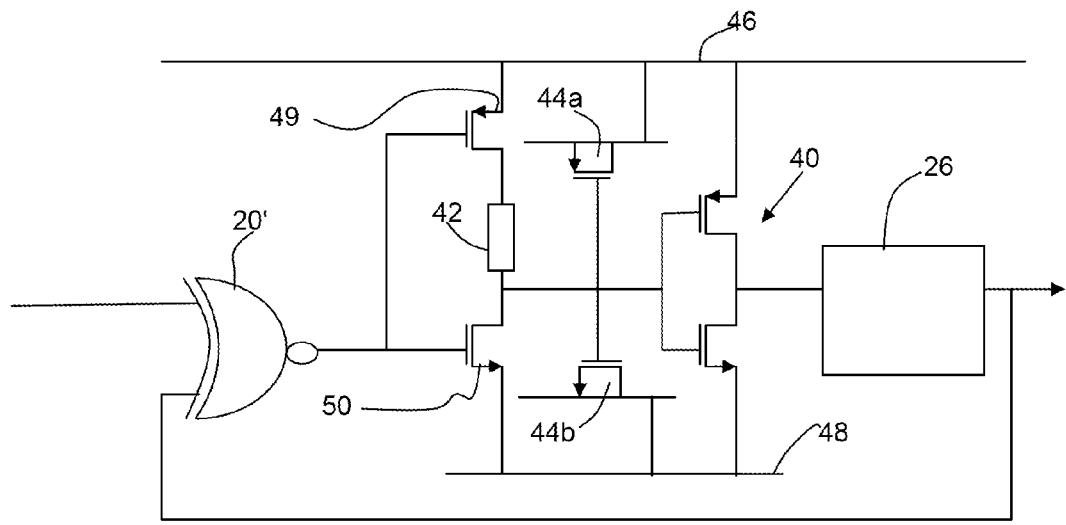
FIG. 7 shows a first example of implementation of the circuit of FIG. 5 in more detail.

FIG. 7 shows an example of actual circuit implementation.

The same circuit elements are given the same reference numbers as in FIG. 2. Note that in FIG. 7, the input circuit is an XNOR gate 20'.

An additional buffer circuit 40 as mentioned above is shown between the filter circuit and the flip flop 26.

The RC filter comprises a resistor 42 and two capacitors which are implemented as transistors 44a,44b. These extend to the high and low power rails 46, 48 as shown.

This example shows the use of an XNOR gate 20', and the output is inverted by an inverter stage comprising transistors 49,50. Thus, the XNOR gate 20' and the inverter stage function in the same way as the XOR gate 20 of FIG. 2.

Figure 8:
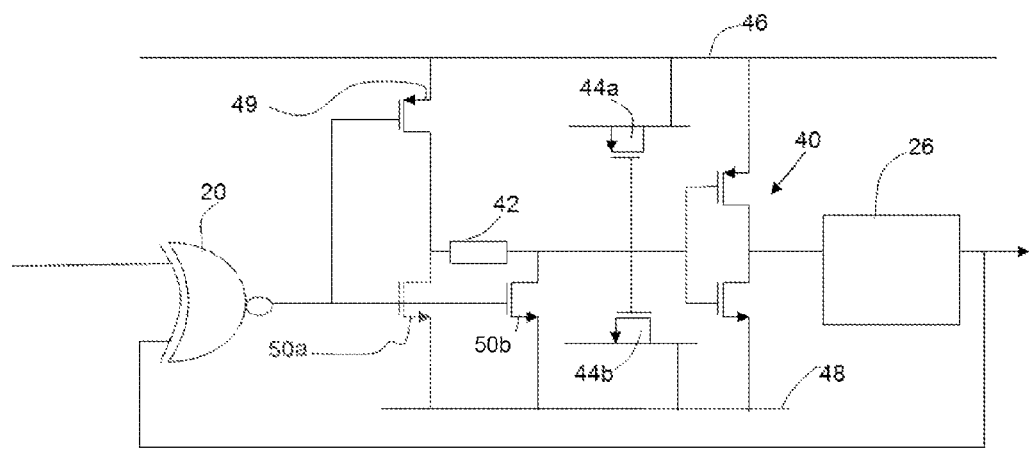
FIG. 8 shows a second example of implementation of the circuit of FIG. 5 in more detail.

FIG. 8 shows a modification to FIG. 7 in which the transistor 50 is shown as two separate devices 50a, 50b. The transistor 50a is the pull down transistor of the inverter stage, and the transistor 50b provides the reset function explained with reference to FIG. 5, and thus corresponds to transistor 28. The transistors 50a and 50b are effectively in parallel and switched together, so that they can be implemented as a single device as in FIG. 7. Thus, FIG. 7 includes the reset function explained above, with the lower inverter transistor performing a dual function.

The circuit has been implemented and tested in silicon and the results are given in the table below.

|  | $T_R$ | $T_F$ | Mismatch |
|---|---|---|---|
| RC based filter | 5.70 ns | 4.64 ns | 22% |
| Proposed filter | 5.74 ns | 5.84 ns | 2% |

Figure 1:
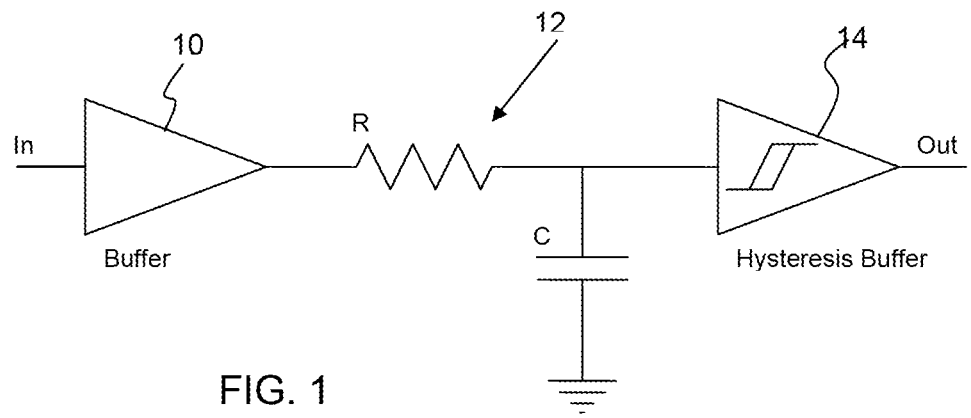
FIG. 1 shows a known glitch filter circuit in schematic form.

This table show the rise time delay and fall time delay introduced by the glitch filter, for a conventional circuit of FIG. 1 and for the circuit of FIG. 7. The mismatch is shown as reduced from 22% to 2%.

In this simulation, apart from the filter circuit, all other circuit components are identical. The simulation and measurement results show that the circuit has a significant advantage compared to a simple RC based system in reducing the duty cycle distortion.

The glitch filter circuit of the invention can for example be used in an IIC I/O cell, and can be implemented as a 50 ns glitch filter. In this application, rise and fall delay mismatch can create problems in timing. The invention can however be used not only in an I/O cell but also in other circuits where rise fall delay mismatch of a glitch filter can create problems or duty cycle distortion is not tolerable.

In the example above, the input circuit is shown as an XOR or XNOR gate processing the input and output signals (via a feedback path).

The purpose of the input circuit generally is to detect a transition in the input and to keep the filter active until it toggles the output. The result is that both rising and falling transitions are detected.

As shown above, an XNOR gate can be used which will give a low output when the input and output are not equal. This will start the charging cycle of the filter circuit. The XNOR output will remain low until the filter circuit toggles the output flip-flop, or the input returns to the original state before the flip-flop toggles. Any inequality comparator which gives an active output when both inputs are not equal such as an XOR gate can be used. The same function can also be achieved in a variety of other ways, such as a two-input multiplexer or any other logic block. The comparison does not need to be exactly between the input and output. Any intermediate signal (for example from the output circuit 26) can be used instead of the actual output.

In the example above, the filter circuit is shown as an RC filter. Other circuits can implement this delay function such as a chain of inverters, or a long transmission line.

The effect of the delay in combination with the input circuit is that transitions in the input are converted into pulses of a short delay (but longer than the maximum glitch delay).

In the example above, the output circuit is shown as a T flip flop. However, the purpose is simply to convert successive output signals from the filter circuit into alternate high and low transitions, thereby halving the frequency.

Other circuits can implement this toggling or frequency dividing function.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A glitch filter circuit comprising:
    an input circuit having a first input and a second input, wherein the input circuit is configured to detect both rising and falling signal level transitions of an input signal at the first input;
    an RC delay circuit at an output of the input circuit;
    an output circuit coupled to an output of the RC delay circuit, wherein the output circuit comprises a T-type flip flop and is configured to toggle an output of the glitch filter circuit between high and low levels in response to the RC delay circuit output; and
    a feedback path from the output circuit to the second input of the input circuit, wherein the input signal enters the glitch filter only at the first input.

2. The glitch filter circuit as claimed in claim 1, wherein the RC delay circuit comprises a filter circuit.

3. The glitch filter circuit as claimed in claim 2, wherein the filter circuit comprises an RC filter.

4. The glitch filter circuit as claimed in claim 1, wherein the input circuit comprises one of an XOR gate and an XNOR gate having its inputs connected to the input and output of the glitch filter circuit.

5. The glitch filter circuit as claimed in claim 1, further comprising:
    a reset circuit for resetting an output of the delay circuit.

6. An input/output circuit comprising the glitch filter circuit as claimed in claim 1.

* * * * *